United States Patent
Sugiyama et al.

(10) Patent No.: US 11,394,222 B2
(45) Date of Patent: Jul. 19, 2022

(54) SECONDARY BATTERY SYSTEM, SECONDARY BATTERY, AND ASSEMBLED BATTERY SYSTEM

(71) Applicant: KABUSHIKI KAISHA TOSHIBA, Tokyo (JP)

(72) Inventors: Nobukatsu Sugiyama, Kawasaki Kanagawa (JP); Yumi Fujita, Tokyo (JP); Tomokazu Morita, Funabashi Chiba (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 276 days.

(21) Appl. No.: 16/556,266

(22) Filed: Aug. 30, 2019

(65) Prior Publication Data
US 2020/0295584 A1    Sep. 17, 2020

(30) Foreign Application Priority Data
Mar. 11, 2019 (JP) .............................. JP2019-043439

(51) Int. Cl.
*H02J 7/00* (2006.01)
*H01M 10/42* (2006.01)
(Continued)

(52) U.S. Cl.
CPC ............ *H02J 7/0068* (2013.01); *G01R 19/10* (2013.01); *H01M 10/4257* (2013.01);
(Continued)

(58) Field of Classification Search
CPC .... H02J 7/0068; H02J 7/00714; G01R 19/10; H01M 10/4257; H01M 10/441;
(Continued)

(56) References Cited

U.S. PATENT DOCUMENTS 7,803,481 B2 * 9/2010 Howard .............. H01M 10/052
429/121
8,749,201 B2 * 6/2014 Skelton ............. H01M 10/4207
320/132
(Continued)

FOREIGN PATENT DOCUMENTS

CN 101944587 B * 10/2013 ............. Y02E 60/10
JP 2013073823 A * 4/2013 ............. H01M 4/13
(Continued)

*Primary Examiner* — M Baye Diao
(74) *Attorney, Agent, or Firm* — Finnegan, Henderson, Farabow, Garrett & Dunner L.L.P.

(57) ABSTRACT

According to an embodiment, a secondary battery system includes a secondary battery, a calculator, and a controller. The secondary battery includes a first electrode including a first and second active materials, and a second electrode including a third active material. The calculator calculates a current ratio of currents passing through the first and second active materials for each of different values of a charge amount of the first electrode, based on capacities and capacity-versus-potential properties of the first and second active materials. The controller, based on the capacities of the first and second active materials and the current ratio when the charge amount of the first electrode takes a first value, controls the current passing through the secondary battery when the charge amount indicates the first value.

10 Claims, 9 Drawing Sheets

(51) Int. Cl.
*H01M 10/44* (2006.01)
*G01R 19/10* (2006.01)
*H01M 50/20* (2021.01)

(52) U.S. Cl.
CPC ......... *H01M 10/441* (2013.01); *H01M 50/20* (2021.01); *H01M 2010/4271* (2013.01); *H01M 2010/4292* (2013.01)

(58) Field of Classification Search
CPC ......... H01M 50/20; H01M 2010/4271; H01M 2010/4292; H01M 2004/028; H01M 4/364; H01M 10/44; H01M 10/425; Y02E 60/10
USPC ........................................................ 320/134
See application file for complete search history.

(56) References Cited

U.S. PATENT DOCUMENTS

| | | | | |
|---|---|---|---|---|
| 9,041,405 | B2* | 5/2015 | Sejima | G01R 31/392 |
| | | | | 324/426 |
| 10,270,127 | B2* | 4/2019 | Ohara | H01M 50/44 |
| 10,591,550 | B2* | 3/2020 | Yonemoto | G01R 31/367 |
| 10,677,850 | B2* | 6/2020 | Goto | G01R 31/382 |
| 2015/0160300 | A1 | 6/2015 | Ishii et al. | |
| 2017/0263984 | A1 | 9/2017 | Fujita et al. | |
| 2019/0341784 | A1* | 11/2019 | Lee | G01R 31/3842 |

FOREIGN PATENT DOCUMENTS

| | | |
|---|---|---|
| JP | 2014-216263 A | 11/2014 |
| JP | 2015-111086 A | 6/2015 |
| JP | 6038275 B2 | 12/2016 |
| JP | 2017-166874 A | 9/2017 |

\* cited by examiner

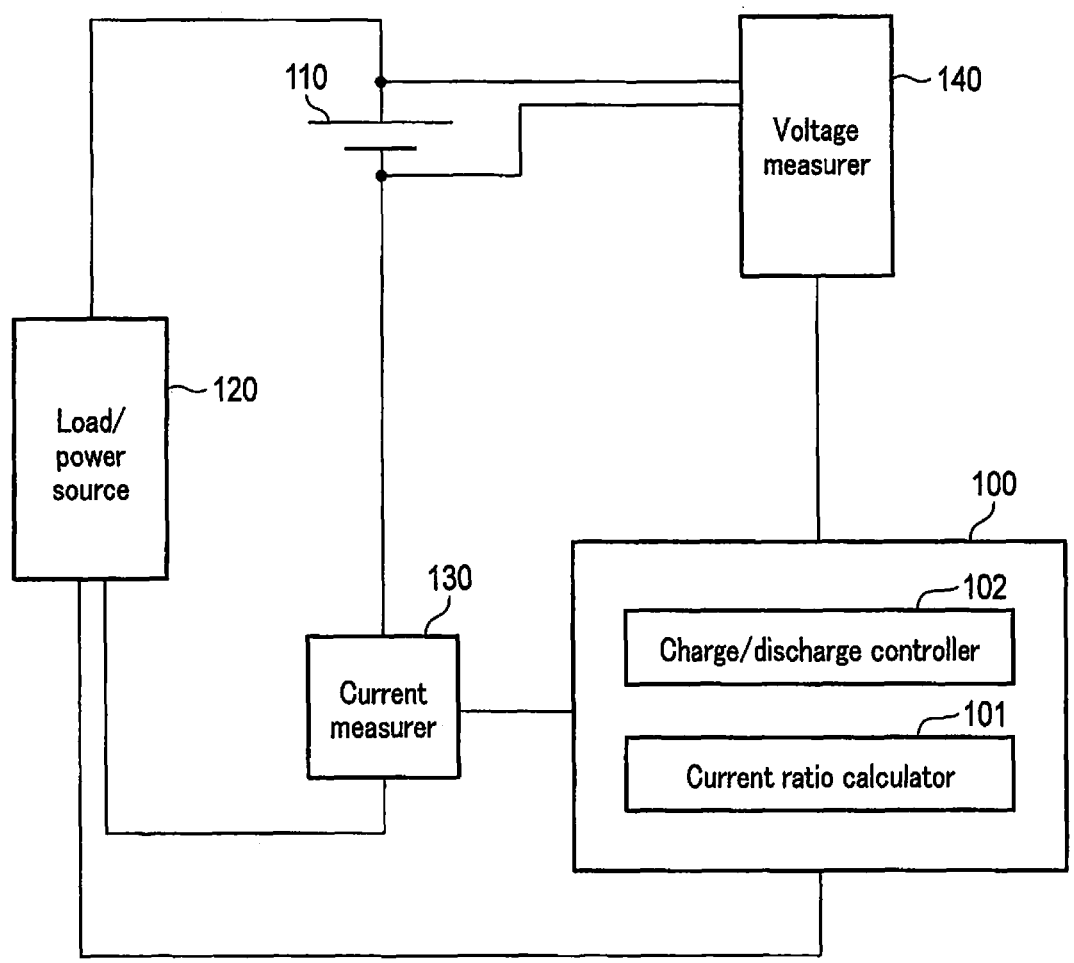
F I G. 1

SECONDARY BATTERY SYSTEM, SECONDARY BATTERY, AND ASSEMBLED BATTERY SYSTEM

CROSS-REFERENCE TO RELATED APPLICATIONS

This application is based upon and claims the benefit of priority from Japanese Patent Application No. 2019-043439, filed Mar. 11, 2019, the entire contents of which are incorporated herein by reference.

FIELD

Embodiments described herein relate generally to a secondary battery having electrodes prepared from a mixture of multiple active materials.

BACKGROUND

Recently, as the prevalence of electronic devices including information-related devices and communication devices increases, so too does the prevalence of secondary batteries that serve as a power supply to such devices. Secondary batteries are also advancing in popularity in the fields of electric vehicles (EV) and renewable energy. Particularly, a lithium-ion secondary battery has been broadly used because of its high energy density and easiness of being downsized.

The lithium-ion secondary battery charges and discharges electric energy with the active material of the cathode and anode absorbing and releasing lithium ions. Specifically, at the time of charging, lithium ions released from the cathode are absorbed by the anode, whereas at the time of discharging, lithium ions discharged from the anode are absorbed by the cathode.

The electrodes, or in other words, cathodes and/or anodes, of typical lithium-ion secondary batteries are formed using a single active material. For the purposes of increased capacity and increased lifespan, electrodes prepared from a mixture of active materials of multiple types may be used. Such electrodes may exhibit complex properties in comparison to electrodes formed from a single active material. Depending on the capacity region of the battery for use, the amount of charging and/or discharging current for the battery, or the like, deterioration of the secondary battery may be increasingly advanced.

In a known conventional technique, for example, when a cathode active material having a relatively small capacity ratio is mainly undergoing charging reaction, the charge current is set to a smaller value than when a cathode active material having a relatively large capacity ratio is mainly undergoing charging reaction.

With the conventional technique, however, which of one active material and the other active material is undergoing the charging reaction and to what extent cannot be accurately estimated. For example, a load on an active material may largely differ when this active material is almost solely undergoing the charging reaction, from when the active material is undergoing charging reaction slightly more than the other active material. For this reason, even if a cathode active material having a relatively small capacity ratio is mainly undergoing charging reaction, the charge current may not have to be considerably restricted depending on the degree of charging reaction. In contrast, even if a cathode active material having a relatively large capacity ratio is mainly undergoing charging reaction, the charge current may need to be considerably restricted depending on the degree of charging reaction.

BRIEF DESCRIPTION OF THE DRAWINGS

FIG. 1 is a block diagram showing a secondary battery system according to the first embodiment.

DETAILED DESCRIPTION

Figure 2:
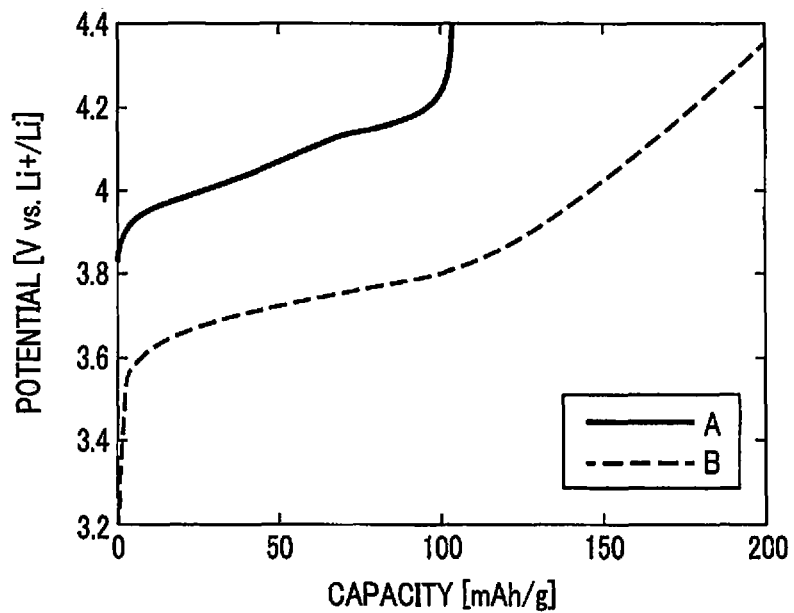
FIG. 2 is a graph showing the capacity-versus-potential properties of two different active materials.

According to an embodiment, a secondary battery system includes a secondary battery, a current ratio calculator, and a controller. The secondary battery includes a first electrode including a first active material and a second active material, and a second electrode including at least a third active material. The current ratio calculator calculates a current ratio of a current passing through the first active material and a current passing through the second active material for each of different values of a charge amount of the first electrode, based on a capacity and capacity-versus-potential properties of the first active material and a capacity and capacity-versus-potential properties of the second active material. The controller, based on the capacity of the first active material, the capacity of the second active material and the current ratio when the charge amount of the first electrode takes a first value, controls the current passing through the secondary battery when the charge amount of the first electrode indicates the first value.

According to another embodiment, a secondary battery system includes a secondary battery, a current ratio calculator, and a controller. The secondary battery includes a first electrode including a first active material and a second active material, and a second electrode including at least a third active material. The current ratio calculator calculates a current ratio of a current passing through the first active material and a current passing through the second active material for each of different values of a charge amount of the first electrode, based on a capacity and capacity-versus-potential properties of the first active material and a capacity and capacity-versus-potential properties of the second active material. The setter sets an operational range of the secondary battery based on the capacity of the first active material, the capacity of the second active material, and the current ratio.

According to still another embodiment, a secondary battery includes a first electrode and a second electrode. The first electrode includes a first active material and a second active material. The second electrode includes at least a third active material. An initial charge amount of the second electrode is larger than an initial charge amount of the first electrode. In at least part of a range in which the charge amount of the first electrode is smaller than the initial charge amount of the second electrode, a product of (a) a first ratio of a current passing through the first active material to a current passing through the first electrode, (b) a reciprocal of a second ratio of a capacity of the first active material to a capacity of the first electrode, and (c) a constant, exceeds a threshold value.

According to still another an assembled battery system includes an assembled battery, an internal state calculator, a current ratio calculator, and a controller. The assembled battery includes a plurality of secondary batteries coupled in parallel or in series. Each of the secondary batteries includes a first electrode including a first active material and a second active material, and a second electrode including at least a third active material. The internal state calculator performs regression calculation for each of a plurality of battery modules obtained by dividing the secondary batteries, based on input data including at least one of (a) measurement values of currents and/or powers measured at a plurality of time points during charging and/or discharging each battery module and (b) estimated values of currents and/or powers at a plurality of time points during charging and/or discharging the battery module, and to update a capacity of the first active material of the secondary battery included in the battery module and a capacity of the second active material of the secondary battery. The current ratio calculator calculates for each of the battery modules and for each of different values of a charge amount of the first electrode of the secondary battery included in the battery module a current ratio of a current passing through the first active material of the secondary battery and a current passing through the second active material of the secondary battery, based on the capacity and capacity-versus-potential properties of the first active material of the secondary battery and the capacity and capacity-versus-potential properties of the second active material of the secondary battery. The controller determines a recommended current rate, for each of the battery modules, for charging and/or discharging the battery module when the charge amount of the first electrode of the secondary battery included in the battery module takes a first value, based on (a) the capacity of the first active material of the secondary battery, (b) the capacity of the second active material of the secondary battery, and (c) the current ratio when the charge amount of the first electrode of the secondary battery takes the first value, and to control a current passing through the assembled battery, based on the recommended current rate determined for each of the battery modules.

The embodiments will be described below with reference to the drawings. The same or similar reference numerals are applied to the components that are the same as or similar to the explained components, and repetition of explanations made before is basically avoided. The drawings are schematically or conceptually illustrated, and therefore the relationship between the thickness and width of each illustrated component and relative sizes of the components may not be the same as the actual arrangement. Furthermore, even if the same portion is described, it may be illustrated differently in sizes and ratios on different drawings.

First, the battery capacity and state of charge (SOC) in this specification will be defined. In general, the capacity of a lithium-ion secondary battery is calculated based on an upper limit voltage determined at the time of charging and a lower limit voltage determined at the time of discharging.

In this specification, however, the capacity of a secondary battery is defined with reference to the open circuit voltage (OCV) of the secondary battery. Specifically, the capacity of the secondary battery is defined as the charging capacity at the time of charging the secondary battery until the OCV changes from the predetermined lower limit voltage to the predetermined upper limit voltage, or as the discharging capacity of the secondary battery at the time of discharging the secondary battery until the OCV changes from the upper limit voltage to the lower limit voltage.

Throughout the specification, the SOC of a secondary battery represents the ratio of the charge amount of the secondary battery to the capacity of the secondary battery when the OCV at the lower limit voltage is 0[%], and the OCV at the upper limit voltage is 100[%].

Throughout the specification, the SOC of the cathode of the secondary battery represents the ratio of the cathode charge amount to the capacity of the cathode when the open circuit potential (OCP) of the cathode at the lower limit potential is 0[%], and the OCP at the upper limit potential is 100[%].

Similarly, throughout the specification, the SOC of the anode of the secondary battery represents the ratio of the anode charge amount with reference to the capacity of the anode when the OCP of the anode at the lower limit potential is 0[%], and the OCP at the upper limit potential is 100[%].

First Embodiment

A secondary battery system according to the first embodiment includes a battery control apparatus 100, a secondary battery 110, a load/power source 120, a current measurer 130, and a voltage measurer 140, as illustrated in FIG. 1.

A typical secondary battery 110 is a lithium-ion secondary battery. The charging and discharging of the secondary battery 110 may be controlled by the battery control apparatus 100. The secondary battery 110 is coupled to the load/power source 120 at the time of discharging or charging.

The secondary battery 110 includes a cathode and an anode. At least one of the cathode and the anode contains different active materials. In the following explanation, it is assumed that the cathode contains two active materials that are an active material A and active material B. Here, the active material A is spinel-type lithium-manganese composite oxide (LMO), and the active material B is lithium-nickel composite oxide (NCA, NCM). The present embodiment and later-described embodiments are also applicable to a cathode containing a combination of different active materials, and to an anode containing different active materials.

The current measurer 130 may be an ammeter. The current measurer 130 measures the current (battery current) passing through the circuit including the secondary battery 110 and the load/power source 120, and outputs a signal indicating the current measurement value to the battery control apparatus 100.

The voltage measurer 140 may be a voltmeter. The voltage measurer 140 measures a voltage (battery voltage) applied to the two ends of the secondary battery 110, and outputs a signal indicating the voltage measurement value to the battery control apparatus 100.

The structure may be further provided with a temperature measurer that measures the temperature of the secondary battery 110 or ambient temperature, although it is not shown.

The battery control apparatus 100 may correspond to a processor and a memory. Typical examples of the processor may be a central processing unit (CPU) and/or graphics processing unit (GPU); however, the examples may also include a microcomputer, a field programmable gate array (FPGA), a digital signal processor (DSP), or any other general-purpose processor or a dedicated processor.

The memory temporarily stores programs to be implemented by the processor to realize the process related to battery control, and data to be used by the processor, such as various measurement values, internal state parameters, and mathematical functions. The memory may include a random access memory (RAM) that has a work area for expanding a program or data.

The battery control apparatus 100 calculates the current ratios of the currents passing through different active materials in the target electrode (e.g., cathode) of the secondary battery 110 under different charge amounts (or SOCs) of the electrode of the secondary battery 110. Based on the relationship between the charge amount and the current ratio, the battery control apparatus 100 controls the current passing through the secondary battery 110 so that, for example, the charging rate and/or discharging rate of the secondary battery 110 can be reduced in a certain charge amount region.

In particular, the battery control apparatus 100 includes a current ratio calculator 101 and a charge/discharge controller 102.

The current ratio calculator 101 calculates the current ratios between the active material A and the active material B under different charge amounts of the secondary battery 110, based on the capacities of the active material A and active material B and their capacity-versus-potential properties. Thereafter, the current ratio calculator 101 sends the calculated current ratio to the charge/discharge controller 102. It is assumed that the capacities of the active material A and/or active material B are predetermined. The capacities, however, may be estimated and updated in accordance with the deterioration of the secondary battery 110 that gradually advances, as explained in the later described fifth embodiment.

The capacity of the active material A is set as Ma[g], and the capacity of the active material B is set as Mb[g]. Examples of the capacity-versus-potential properties include a function fa( ) that returns the potential (OCP) of the active material A with a charge amount per unit mass of the active material A as an argument, and a function fb( ) that returns the potential (OCP) of the active material B with a charge amount per unit mass of the active material B as an argument. These functions are predetermined from experiments or simulations, and stored in the memory. Instead of the functions, curve data or a look-up table (LUT) may be stored.

These functions fa( ) and fb( ) are exemplified in FIG. 2. In FIG. 2, the function fa( ) is plotted as a curve A, and the function fb( ) is plotted as a curve B. Furthermore, the functions for returning the potential (OCP) of the cathode from the charge amount per unit mass of each cathode when the mixture ratios between the active material A and active material B are 10:0, 8:2, 6:4, 4:6, 2:8 and 0:10, are exemplified in FIG. 3. If the mixture ratio is 10:0 or 0:10, the function will be the same as function fa( ) or fb( ), respectively, in FIG. 2. In the following explanation, the mixture ratio denotes a ratio of masses, unless otherwise specified.

The potential of the active material A is equal to the potential of the cathode, and the potential of the active material B is also equal to the potential of the cathode. This means that the potential of the active material A is equal to the potential of the active material B. As a result, the following equation (1) is established.

$$fa\left(\frac{Qa}{Ma}\right) = fb\left(\frac{Qb}{Mb}\right) \qquad (1)$$

In equation (1), Qa and Qb each denote the charge amount of the active material A and the charge amount of the active material B when the charge amount of the cathode is Q. Although Qa and Qb are unknown, the sum of Qa and Qb is equal to Q.

Since equation (1) contains a single unknown number as indicated below, the current ratio calculator 101 can identify the combination of Qa and Qb that satisfies equation (1), for example, from numerical computation.

$$fa\left(\frac{Qa}{Ma}\right) = fb\left(\frac{Q-Qa}{Mb}\right) \qquad (2)$$

Supposing that a charge/discharge current is passed over a short time period Δt, the charge amount of the cathode changes from Q to Q+iΔt. Concurrently, the charge amount of the active material A changes from Qa to Qa+iaΔt, and the charge amount of the active material B changes from Qb to Qb+ibΔt. Here, ia and ib denote the sizes of currents that pass through the active material A and active material B, respectively, during the short time period Δt. The ratio ia:ib denotes the current ratio calculated by the current ratio calculator 101.

The following equation (3) is derived by the first order approximation.

$$fa\left(\frac{Qa}{Ma}\right) + \frac{ia\Delta t}{Ma}fa'\left(\frac{Qa}{Ma}\right) = fb\left(\frac{Qb}{Mb}\right) + \frac{ib\Delta t}{Mb}fb'\left(\frac{Qb}{Mb}\right). \qquad (3)$$

In equation (3), fa'( ) and fb'( ) are derivatives of functions fa( ) and fb( ), respectively. The data (or alternatively, curve data or LUT) of derivatives fa'( ) and fb'( ) may be precalculated and stored in the memory. Equation (3) can be simplified as follows, by using the above equation (1):

$$\frac{ia\Delta t}{Ma}fa'\left(\frac{Qa}{Ma}\right) = \frac{ib\Delta t}{Mb}fb'\left(\frac{Qb}{Mb}\right). \qquad (4)$$

Although ia and ib are unknown, the sum of ia and ib is equal to i. Thus, ib=i−ia is established. By substituting this to equation (4), equation (5) is derived as indicated below.

$$\frac{ia}{i} = \frac{fb'\left(\frac{Qb}{Mb}\right)Ma}{fa'\left(\frac{Qa}{Ma}\right)Mb + fb'\left(\frac{Qb}{Mb}\right)Ma} \quad (5)$$

Because ib=i−ia, the following equation (6) is established.

$$\frac{ib}{i} = \frac{fa'\left(\frac{Qa}{Ma}\right)Mb}{fa'\left(\frac{Qa}{Ma}\right)Mb + fb'\left(\frac{Qb}{Mb}\right)Ma} \quad (6)$$

In view of the above, the current ratio calculator 101 simply needs to calculate the current ratio represented in equation (7).

$$ia:ib = fb'\left(\frac{Qb}{Mb}\right)Ma : fa'\left(\frac{Qa}{Ma}\right)Mb \quad (7)$$

Figure 3:
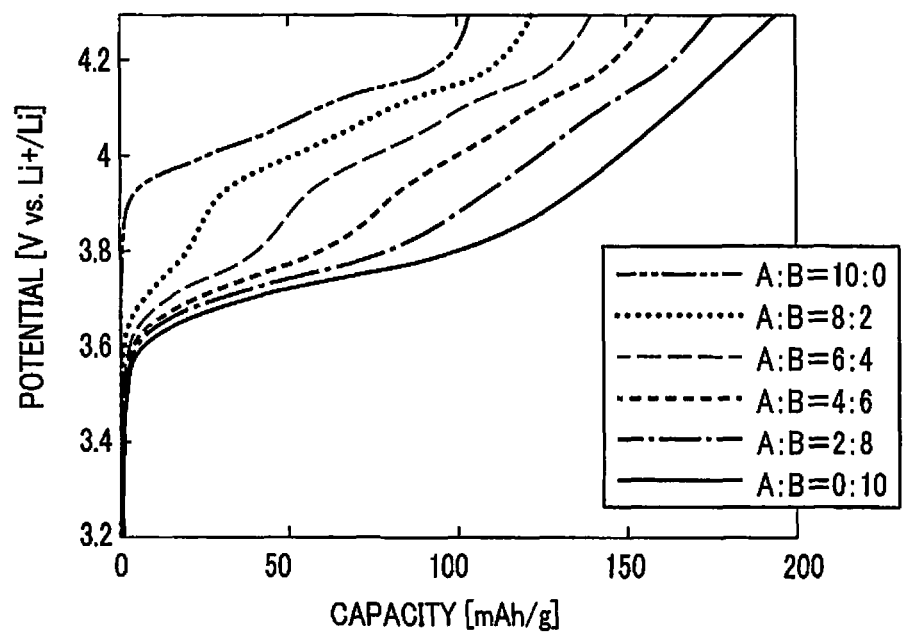
FIG. 3 is a graph showing the capacity-versus-potential properties of cathodes prepared by mixing the active materials of FIG. 2 in different mixture ratios.
Figure 4:
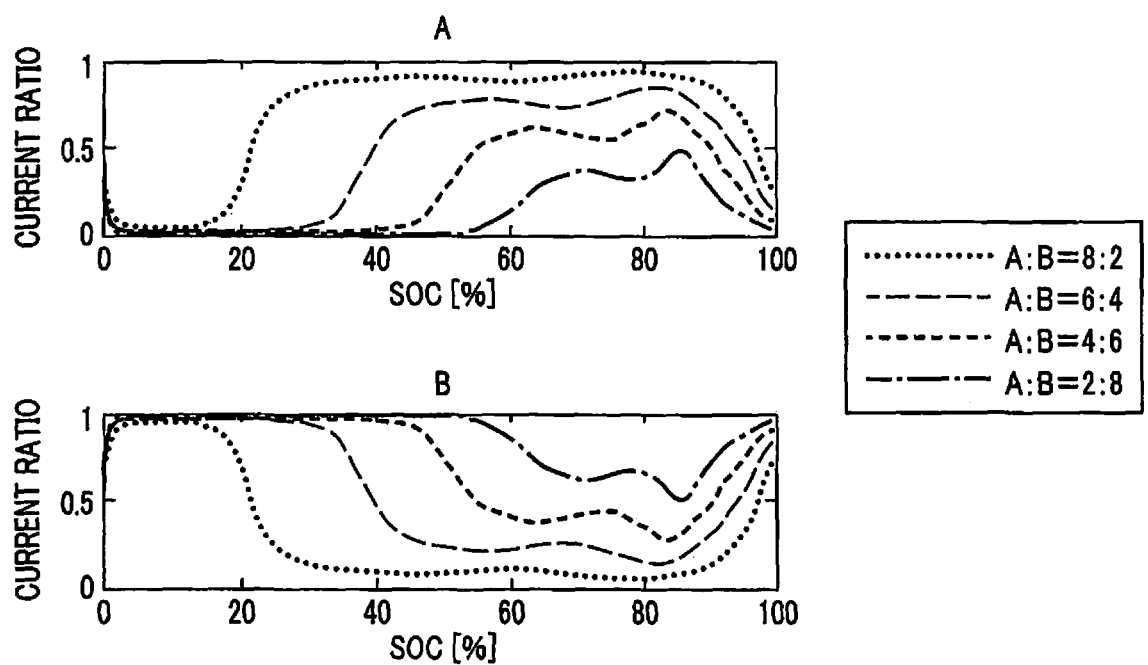
FIG. 4 is a graph showing a current ratio between the active materials in each of the cathodes of FIG. 3.

When the current ratios are calculated in the above manner for the cathodes having different mixture ratios as exemplified in FIG. 3, the graph of FIG. 4 can be obtained. Although FIG. 3 includes OCP curves for the cathodes having mixture ratios of 10:0 and 0:10, these electrodes are not mixed electrodes. In other words, the current always passes through a single active material. Thus, these cathodes are omitted from the explanation.

By referring to FIG. 4, regardless of the mixture ratio of the cathode, the current passes mainly through the active material B in the low-SOC region of the cathode, while the current passes mainly through the active material A in the high-SOC region of the cathode (approximately up to 85%). However, the range of SOC of the cathode within which the current ratio with respect to each active material increases largely depends on the mixture ratio of the cathode. For example, if the mixture ratio of the active material A to the active material B is 8:2, the current passes mainly through the active material. B in the range of the SOC of the cathode approximately between 0[%] and 25[%], and through the active material A in the range of the SOC approximately between 25[%] and 95[%]. On the other hand, if the mixture ratio of the active material A to the active material B is 2:8, the current that passes through the active material A is slightly larger than the current that passes through the active material B in the range of the SOC of the cathode approximately between 70[%] to 85[%], and the current passes mainly through the active material B in the remaining range.

The battery control apparatus 100 may receive from the current measurer 130 a signal indicating the current measurement value every unit time, and perform time integration on the current measurement value to estimate the charge amount of the secondary battery 110. The functional block that performs this operation may be referred to as a battery charge amount estimator.

The battery control apparatus 100 can estimate the charge amount of the cathode by adding the initial charge amount of the cathode of the secondary battery 110 to the estimated charge amount of the secondary battery 110. The functional block that performs such an operation may be referred to as a cathode charge amount estimator. The initial charge amount of the cathode represents the charge amount of the cathode when the SOC of the cathode is 0. The initial charge amount of the cathode may be predetermined and stored in the memory, or may be estimated by the battery control apparatus 100 (or cathode charge amount estimator).

In addition, the battery control apparatus 100 may estimate the SOC of the cathode of the secondary battery 110 by dividing the estimated charge amount of the cathode of the secondary battery 110 by the capacity of the cathode. The functional block that performs this operation may be referred to as a cathode SOC estimator.

Thereafter, the charge/discharge controller 102 receives a current ratio from the current ratio calculator 101, and the SOC estimate of the cathode of the secondary battery 110 from the battery control apparatus 100 (or from the cathode SOC estimator). The charge/discharge controller 102 controls the current passing through the secondary battery 110, or in other words the charge current and/or discharge current, based on the current ratio corresponding to the SOC estimate of the cathode of the secondary battery 110 and the capacities of the active material A and active material B.

Specifically, the charge/discharge controller 102 may control the current rate of the secondary battery 110 for charging and/or discharging when the charge amount of the cathode of the secondary battery 110 takes a certain value, based on the current ratio and the capacities of the active material A and active material B.

For example the charge/discharge controller 102 may calculate the substantial charging/discharging rates of the active material A and active material B, and reduce the charging/discharging rate of the secondary battery 110 so that the substantial charging/discharging rate for each active material will not exceed a threshold value. The tolerance to a load may differ depending on the type of active material. The threshold value therefore may be determined in accordance with each active material. Specifically, the first threshold value, for example, 2 C, may be applied to one active material, while the second threshold value, for example, 3 C, may be applied to another active material having a greater tolerance to a load.

The substantial charging/discharging rate of an active material may be derived from the product of the charging/discharging rate of the secondary battery, the reciprocal of the ratio (e.g., 0.2, 0.4, 0.6, or 0.8) of the capacity of this active material to the capacity of the cathode, and the ratio of the current passing the active material to the current passing through the cathode. This represents the load on each active material. The ratio of the capacity of the active material A to the capacity of the cathode is Ca*Ma/(Ca*Ma+Cb*Mb), the ratio of the capacity of the active material B to the capacity of the cathode is Cb*Mb/(Ca*Ma+Cb*Mb), the ratio of the current passing through the active material A to the current passing through the cathode is ia/(ia+ib), and the ratio of the current passing through the active material B to the current passing through the cathode is ib/(ia+ib). Ca [mAh/g] denotes the capacity of the active material A per unit mass when SOC is 0% to 100%, and Cb [mAh/g] denotes the capacity of the active material B per unit mass when SOC is 0% to 100%. In place of the ratio of the capacity of an active material, the ratio of the mass of the active material may be adopted. For example, the ratio of the mass of the active material A to the mass of the cathode is Ma/(Ma+Mb), and the ratio of the mass of the active material B to the mass of the cathode is Mb/(Ma+Mb).

Figure 5:
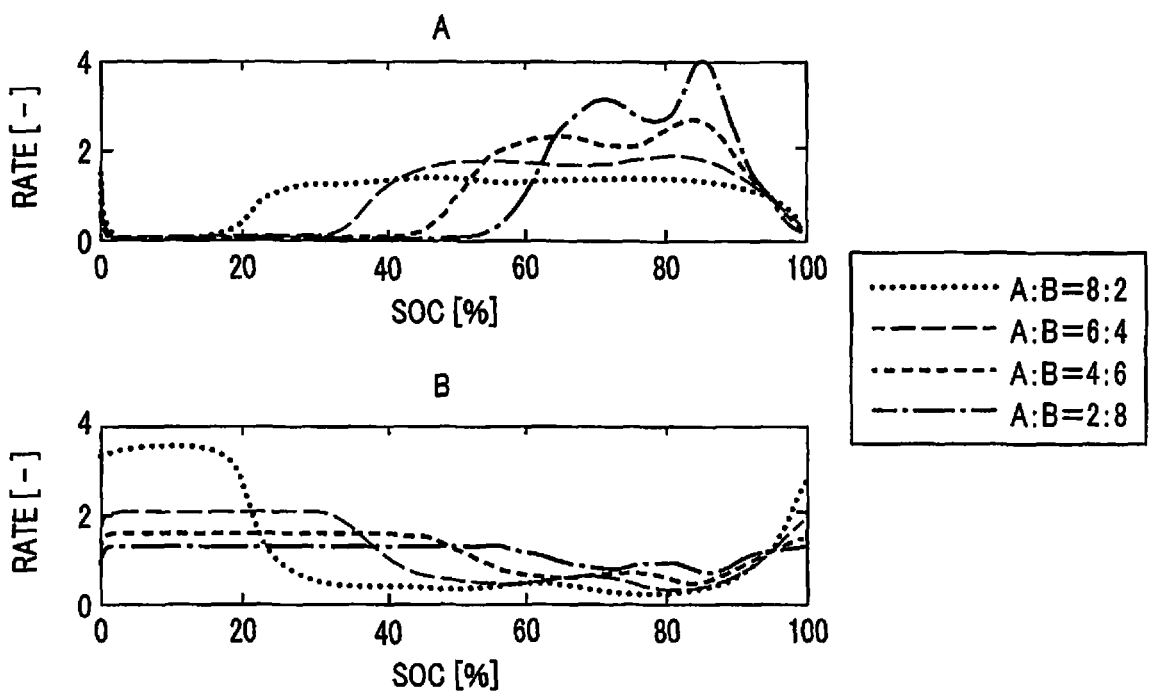
FIG. 5 is a graph showing the substantial charging rate of each of the active materials when charging the secondary batteries including the cathodes of FIG. 3 at constant rate.

By calculating the charging rate of each active material in accordance with the graph of FIG. 4 under a condition that a secondary battery having a cathode prepared with multiple active materials of different mixture ratios is charged at a constant rate of 1 C, the graph of FIG. 5 is obtained.

The charge/discharge controller 102 may determine the charging/discharging rate of the secondary battery 110 in accordance with equation (8).

$$R(S) = \begin{cases} R0 & (\text{case } Ra(S)R0 \leq Th \text{ and } Rb(S)R0 \leq Th) \\ \dfrac{Th}{Ra(S)} & (\text{case } Ra(S)R0 > Th \text{ and } Ra(S) \geq Rb(S)) \\ \dfrac{Th}{Rb(S)} & (\text{case } Rb(S)R0 > Th \text{ and } Rb(S) \geq Ra(S)) \end{cases} \quad (8)$$

In equation (8), S denotes the SOC of the cathode, and R(S) denotes the target charging/discharging rate of the secondary battery 110 when the cathode SOC=S. R0 denotes a standard charging/discharging rate, such as 1 C, that is adopted when the charging/discharging rate is not restricted. Ra(S) and Rb(S) denote how many times greater the substantial charging/discharging rates of the active material A and active material B, respectively, are than the charging/discharging rate of the secondary battery 110 when the cathode SOC=S, and Th denotes a threshold, such as 2 C. When the target charging/discharging rate is to be complied with, the charging/discharging rate is restricted in the SOC region within which the substantial charging/discharging rates of the active material A and active material B would exceed the threshold value if the standard charging/discharging rate is adopted. For the remaining SOC region, the standard charging/discharging rate can be adopted.

The charge/discharge controller 102 may determine the maximum charging/discharging rates of the secondary battery 110 in accordance with equation (9). If this is the case, the standard charging/discharging rate may not be determined.

$$R(S) = \begin{cases} \dfrac{Th}{Ra(S)} & (\text{case } Ra(S) \geq Rb(S)) \\ \dfrac{Th}{Rb(S)} & (\text{case } Rb(S) \geq Ra(S)) \end{cases} \quad (9)$$

Figure 6:
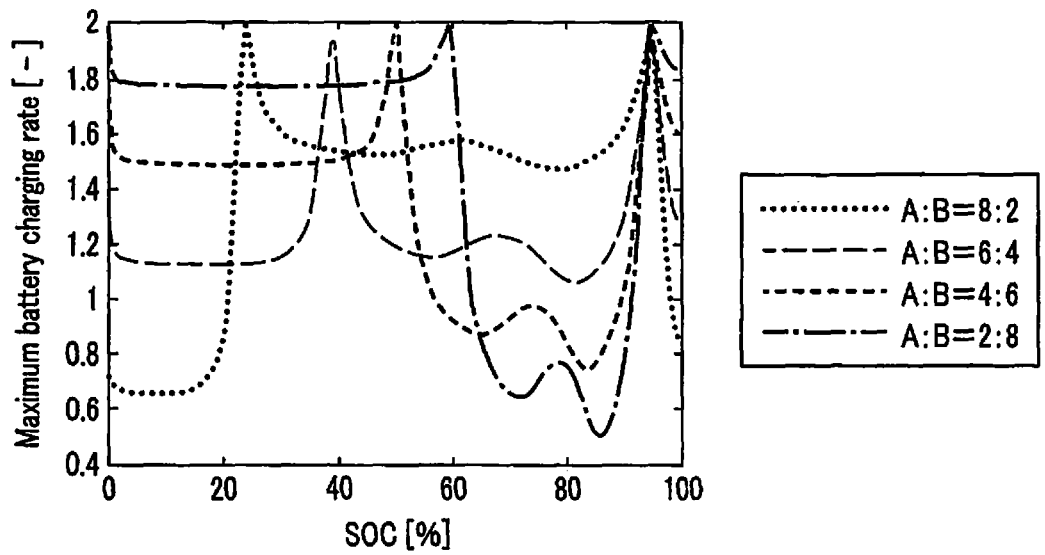
FIG. 6 is a graph showing the charge current control in accordance with FIG. 5.

In the example of FIG. 5, if the threshold value is set to 2 C, the charge/discharge controller 102 may determine the maximum charging rate of the secondary battery 110, as illustrated in FIG. 6. When the maximum charging/discharging rate is to be complied with, the charging/discharging rate can be increased as needed, within the range of the substantial charging/discharging rates of the active material A and active material B not exceeding the threshold value.

Upon receipt of a command for charging/discharging the secondary battery 110 at a rate that exceeds the target charging/discharging rate or maximum charging/discharging rate from an upstream apparatus that is not shown, the charge/discharge controller 102 may control the charging/discharging rate of the secondary battery 110 in such a manner that the charging/discharging rate will be smaller than or equal to the target charging/discharging rate or maximum charging/discharging rate.

The charge/discharge controller 102 may reduce the charging/discharging rate of the secondary battery 110 so that the substantial charging/discharging rate of each active material will not exceed the threshold value. Depending on the specifications of the secondary battery 110, however, the instantaneous value of the substantial charging/discharging rate of the active material A or active material B may be allowed to exceed the threshold value. For example, the charge/discharge controller 102 may reduce the charging/discharging rate of the secondary battery 110 so that the moving average of the substantial charging/discharging rates of each active material over the latest certain period of time will not exceed the threshold value. This period of time may be determined based on the specifications of the secondary battery 110.

Figure 7:
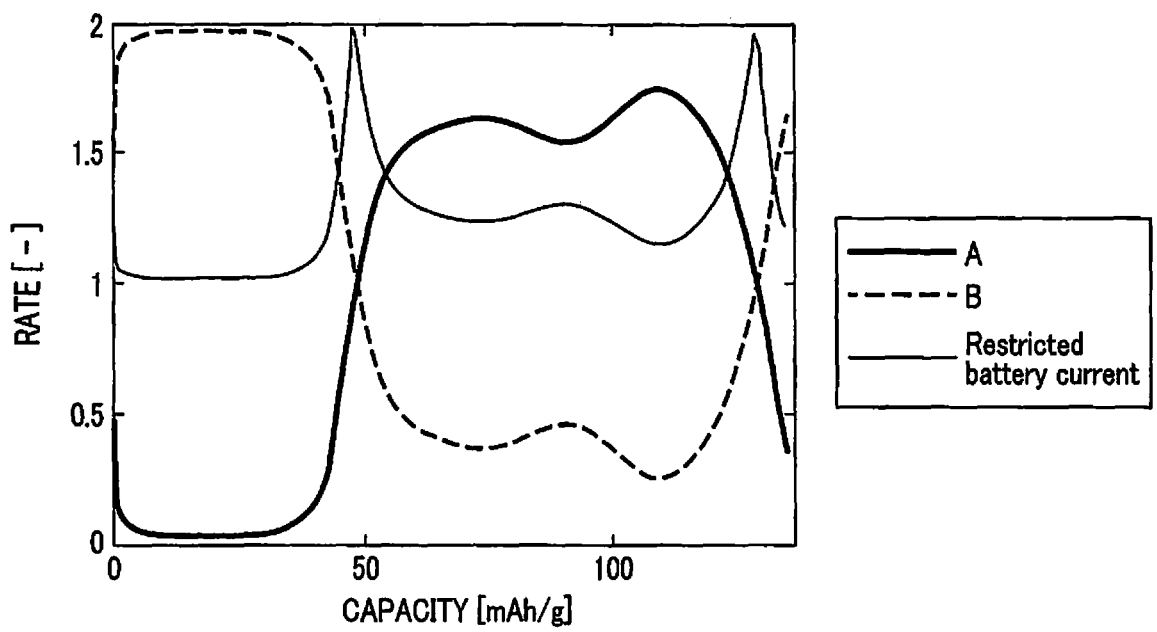
FIG. 7 is a graph showing the charge current control of the cathodes prepared by mixing the active material A and the active material B in the ratio of 1:1.

In the examples of FIGS. 3 to 6, either one of the active material A and the active material B is contained more in the mixture than the other, in all the cathodes. However, the charging/discharging rate may be controlled in a similar manner for a cathode prepared by mixing the same capacities of the active material A and the active material B, in the capacity ratio of 1:1. FIG. 7 shows the substantial charging rates of the active material A and active material B, as well as the maximum charging rate, when the secondary battery 110 includes the above cathode.

According to FIG. 7, in the region of the charge amount being as low as approximately 0 to 40 [mAh/g], the charge current passes mainly through the active material B so that the maximum charging rate of the secondary battery 110 can be maintained around 1 C. On the other hand, in the region of the charge amount being as high as approximately 60 to 120 [mAh/g], the charge current passes mainly through the active material A so that the maximum charging rate of the secondary battery 110 can be maintained around 1.2 C. Even if there is no difference between the capacities of the active material A and the active material B as shown above, restricting the charge current of the secondary battery 110 while taking the load on each active material into consideration is of importance. Furthermore, depending on the combination of active materials, the target charging/discharging rate or the maximum charging/discharging rate when the current passes mainly through one active material may differ from the target charging/discharging rate or the maximum charging/discharging rate when the current passes mainly through another active material. It would therefore be difficult to realize the charge/discharge control with the load on each active material suitably suppressed only by considering the capacity ratio of active materials in a mixed electrode and the region within which each of these active materials mainly undergoes a charging reaction.

Figure 8:
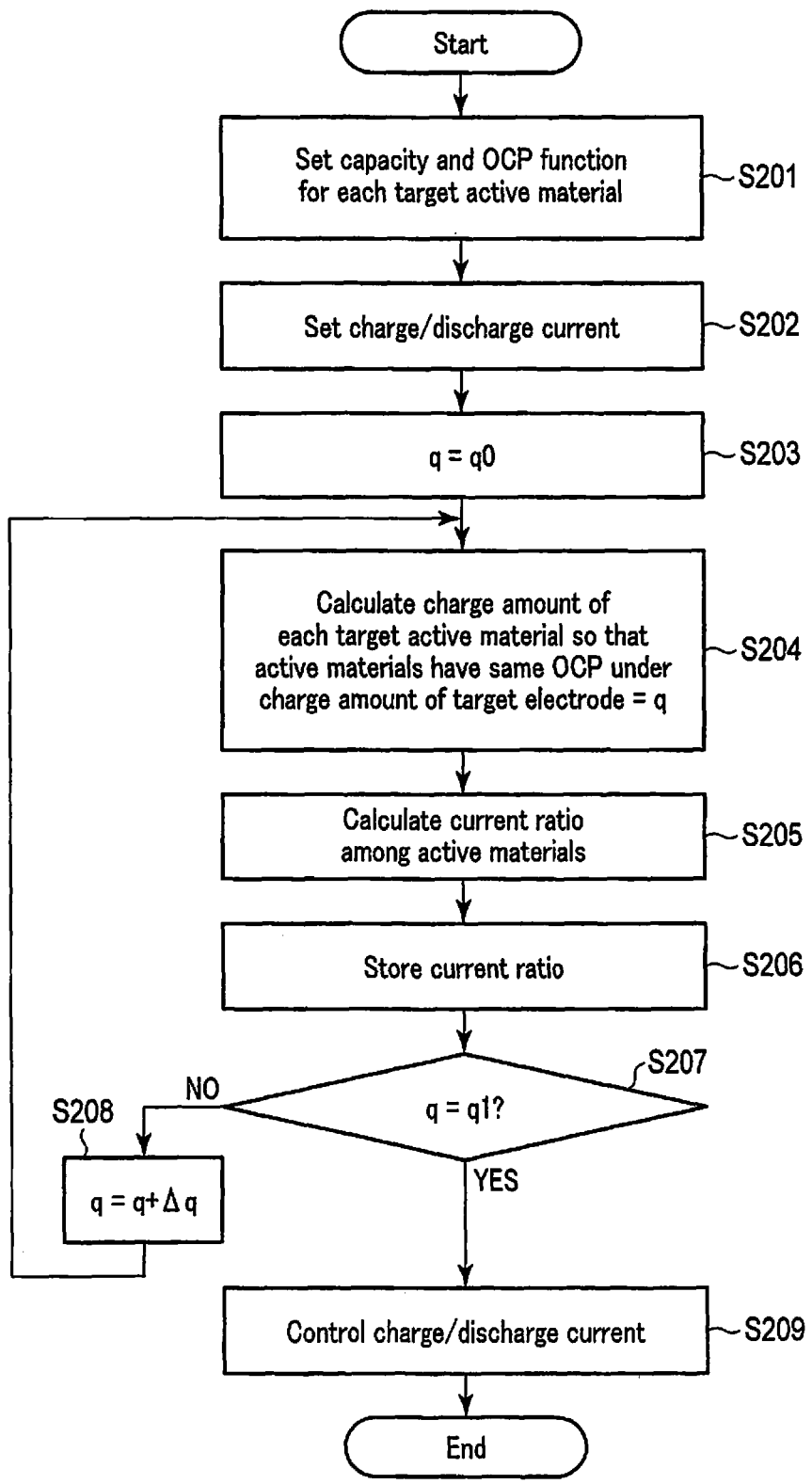
FIG. 8 is a flowchart showing the operation of the secondary battery system illustrated in FIG. 1.

Next, the operation of the secondary battery system of FIG. 1 is explained by referring to FIG. 8. First, the current ratio calculator 101 sets parameters including the capacities of target active materials, and functions including an OCP function and its derivative for each target active material (step S201). A target active material represents, for example, multiple active materials targeted for the calculation of a current ratio, such as the above mentioned active material A and active material B.

The current ratio calculator 101 sets the charge/discharge current amount of the secondary battery 110, for example, the above mentioned value i (step S202). Furthermore, the current ratio calculator 101 substitutes q0 for a variable q that expresses the charge amount of the target electrode for initialization (step S203). The target electrode here denotes mixed electrode that includes target active materials. The value q0 may be the initial charge amount of the target electrode, or may take a larger value.

Steps S201, S202 and S203 may be executed in an order different from FIG. 8, or in parallel. After steps S201 to S203, the process proceeds to step S204.

At step S204, the current ratio calculator 101 calculates the charge amount of each of the target active materials, under the charge amount of the target electrode=q, so as to bring the OCPs of the target active materials to be equal to each other, based on the parameters and functions set at step S201. At step S204, the above equation (2) or similar equation may be used.

Next, the current ratio calculator 101 calculates the current ratio of the target active materials based on the parameters and functions determined at step S201, the charge/discharge current amount determined at step S202, and the charge amount of the target active material calculated at step S204 (step S205). At step S205, the above equation (7) or similar equation may be used. The current ratio calculator 101 stores the current ratio calculated at step S205 in the memory, in association with the value of the variable q (step S206).

After step S206, the current ratio calculator 101 determines whether the variable q reaches q1 (step S207). Here, q1 may be a charge amount corresponding to the target electrode SOC=100[%], or may be a value smaller than this. If it is determined that the variable q has reached q1, the process proceeds to step S209. If not, the process proceeds to step S208.

At step S208, the current ratio calculator 101 updates the variable q by adding Δq thereto. The value Δq may be a fixed value or a variable value. For example, Δq may be a value that changes in accordance with the number of executions at step S207. After step S208, the process returns to step S204.

At step S209, the charge/discharge controller 102 refers to the current ratios of the target active materials obtained by iterating the loop of steps S204 to S208 and stored in the memory, where the SOC of the target electrode takes various values, and based on these current ratios and the capacity of the target active material determined at step S201, the charge/discharge controller 102 controls the charge/discharge current of the secondary battery 110 when the SOC of the target electrode takes various values.

As explained above, the secondary battery system according to the first embodiment controls the current passing through the secondary battery that includes a mixed electrode containing different active materials. Specifically, this secondary battery system calculates the current ratios between active materials with the charge amount of the target electrode varied to different values, based on the capacities and capacity-versus-potential properties of these active materials, and controls the current passing through the secondary battery when the charge amount of the electrode has a certain value, based on the current ratio when the charge amount of the electrode has the certain value and the capacity of each active material. At the time of charging and discharging the secondary battery, the load on each of the active materials included in the mixed electrode largely varies in accordance with the charge amount of the electrode and the types and capacities of the active materials. The secondary battery system estimates the load, and controls the charging/discharging of the secondary battery in accordance with the load on each active material. Thus, according to this secondary battery system, the deterioration of the secondary battery that includes the mixed electrode containing multiple active materials can be suppressed.

Second Embodiment

The above mentioned secondary battery system according to the first embodiment calculates the current ratio of currents passing through multiple active materials included in the target electrode, and controls the current passing through the secondary battery based on this current ratio, thereby suppressing the deterioration of the secondary battery having such an electrode. In contrast, the secondary battery system according to the second embodiment identifies, based on the current ratio, the charge amount (or SOC) region of the target electrode within which a large load is applied to any active material of the electrode, for example the range of approximately 0 to 40 [mAh/g] indicated in FIG. 7, and excludes such a region from the operational range of the secondary battery. In this manner, the deterioration of the secondary battery having a target electrode can be suppressed.

In a stationary secondary battery system, a hybrid electric vehicle (HEV), and plug-in HEV (PHEV), the range of the secondary battery for normal operation may be determined to have a reduced rating capacity of the secondary battery. In such an application example, the deterioration of the secondary battery can be suppressed without the need for control of the charge/discharge current, by excluding the charge amount region of the electrode within which a large load is applied to some of the active materials included in the mixed electrode, from the operational range of the secondary battery.

Figure 9:
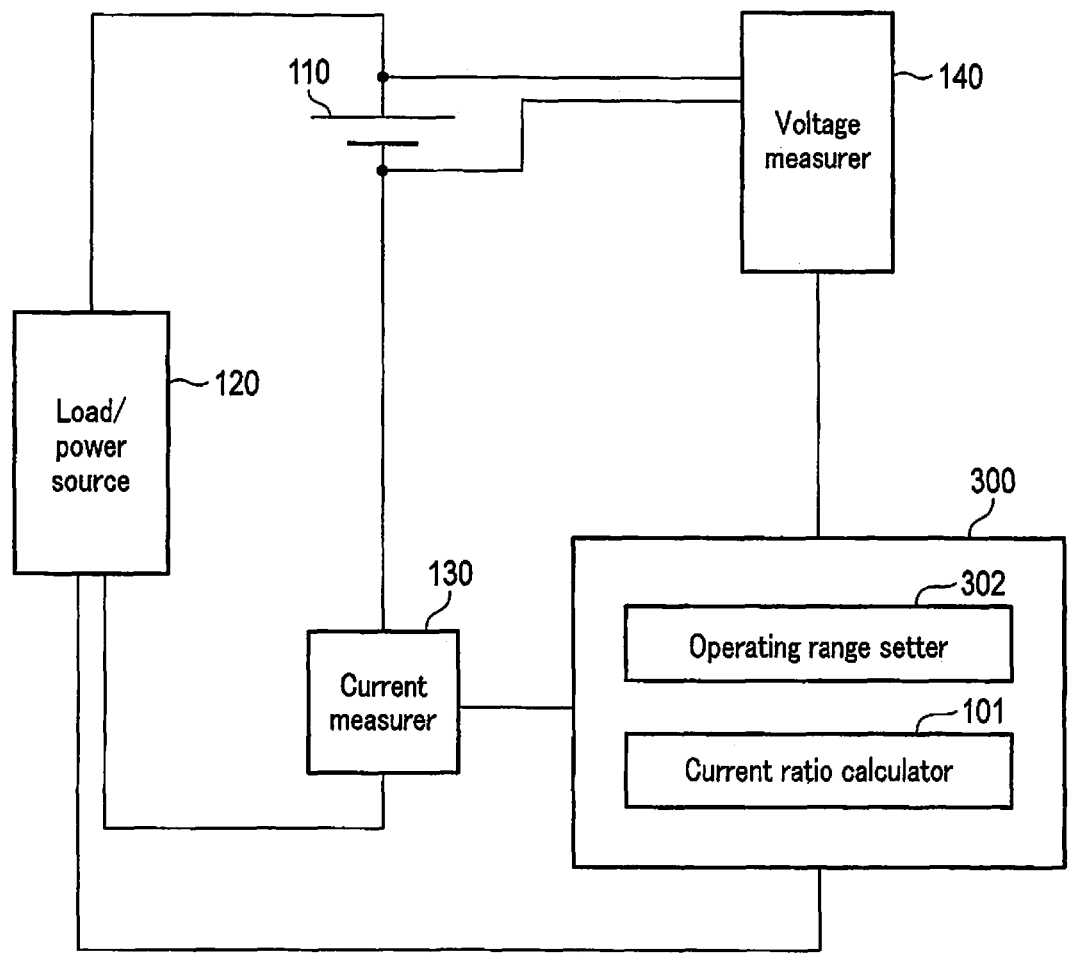
FIG. 9 is a block diagram showing a secondary battery system according to the second embodiment.

As illustrated in FIG. 9, the secondary battery system according to the second embodiment includes a battery control apparatus 300, a secondary battery 110, a load/power source 120, a current measurer 130, and a voltage measurer 140.

The battery control apparatus 300 may correspond to a processor and memory in a manner similar to the above mentioned battery control apparatus 100. Furthermore, in a manner similar to the battery control apparatus 100, the battery control apparatus 300 calculates the current ratios of the current passing through different active materials contained in the target electrode of the secondary battery 110 under different charge amounts of the electrode of the secondary battery 110. The battery control apparatus 300 sets the operational range of the secondary battery 110 based on the relationship between the charge amount and the current ratio, for example, by excluding a certain charge amount region from the operational range of the secondary battery 110.

Specifically, the battery control apparatus 300 includes a current ratio calculator 101 and an operating range setter 302. The operating range setter 302 may be provided in a device that is positioned upstream with reference to the secondary battery system, such as HEV or PHEV, that employs the secondary battery 110. In a manner similar to the battery control apparatus 100, the battery control apparatus 300 may estimate the battery charge amount, the cathode/anode charge amount, and the SOC of the cathode/anode.

The operating range setter 302 receives the current ratio from the current ratio calculator 101, and the SOC estimate of the target electrode of the secondary battery 110 from the battery control apparatus 300 (or cathode/anode SOC estimator). The operating range setter 302 sets the operational region of the secondary battery 110, based on the current ratio corresponding to the SOC estimate of the target electrode of the secondary battery 110 and the capacity of the target active material included in the electrode.

Specifically, the operating range setter 302 may calculate the substantial charging/discharging rate of the target active material and exclude the charge amount range of the target electrode within which the substantial charging/discharging rate of each active material exceeds the threshold value, from the operational range of the secondary battery 110 in a manner similar to the above mentioned charge/discharge controller 102. The tolerance to a load may differ depending on the type of active material. The threshold value therefore may be determined for each active material. Specifically, the first threshold value, for example, 2 C, may be applied to one active material, while the second threshold value, for example, 3 C, may be applied to another active material having a greater tolerance to a load.

The operating range setter 302 may conditionally exclude the charge amount range of the target electrode within which the substantial charging/discharging rate of an active material exceeds the threshold value from the operational range of the secondary battery 110. In this manner, the operational range can be avoided from becoming discontinuous or excessively narrowed. Furthermore, in such a charge amount range, the charge/discharge control similar to the first embodiment may be performed.

The operation of the secondary battery system in FIG. 9 is basically the same as the operation indicated in FIG. 8. In place of step S209, or in addition to this step, the step of the operating range setter 302 setting the operational range of the secondary battery 110 is required.

As explained above, the secondary battery system according to the second embodiment sets the operational range of the secondary battery having a mixed electrode that includes different active materials so as to be smaller than the rating capacity of the secondary battery. Specifically, this secondary battery system calculates the current ratios between active materials with the charge amount of the target electrode varied to different values, based on the capacities and capacity-versus-potential properties of these active materials, and sets the operational range of the secondary battery having the electrode, based on this current ratio and the capacity of each active material. The load applied to the active materials included in the mixed electrode at the time of charging and discharging the secondary battery increases in accordance with the charge amount of the electrode and types and capacities of the active materials. The secondary battery system estimates the load, and sets the operational range of the secondary battery in accordance with the load on each active material. Thus, according to this secondary battery system, the deterioration of the secondary battery that includes the mixed electrode containing multiple active materials can be suppressed.

Third Embodiment

The above mentioned secondary battery system according to the second embodiment suppresses the deterioration of the secondary battery, by excluding the charge amount range of the electrode within which a large load is applied to the active materials included in the target electrode, from the operational range of the secondary battery. In contrast, the secondary battery according to the third embodiment is designed to have the cathode and anode having such potential properties that the chargeable/dischargeable region will be arranged out of the above charge amount range. Specifically, in this secondary battery, the electrode paired with the target electrode is designed to have an initial charge amount the value of which is larger than the above mentioned charge amount range. For example, if the cathode is the mixed electrode, the anode will be designed in this manner.

In the above mentioned FIG. 5, for example, with the mixture ratio of the active material A and active material B being 8:2, the charging rate of the active material B exceeds 2 C when the SOC of the cathode is within the range of approximately 0 to 25[%] and approximately 95[%] and higher. In view of this, the anode may be designed such that the charge amount of the anode when SOC=0[%] approximately matches the charge amount of the cathode when SOC=25[%]. Alternatively, the anode may be designed such that the charge amount of the anode when SOC=100[%] approximately matches the charge amount of the cathode when SOC=95[%].

It should be noted that, no matter how the charge amount range of the electrode paired with the target electrode is designed, a considerable load may be applied, in part of the chargeable/dischargeable region of the secondary battery, to some of the active materials included in the target electrode. For this reason, the charge/discharge control similar to the first embodiment and/or setting of the operational region similar to the second embodiment may be adopted in such a charge amount range.

As discussed above, in the secondary battery according to the third embodiment, the electrode that is paired with the target electrode is designed to have potential properties so that the chargeable/dischargeable region of the secondary battery will be arranged out of the charge amount range of the target electrode, within which the load on the active materials included in the electrode increases. Thus, the secondary battery can suppress the deterioration.

Fourth Embodiment

In the above mentioned first embodiment, the resistance of the target active material is not taken into consideration in the calculation of the current ratio. In the secondary battery system according to the fourth embodiment, the charge/discharge controller 102 takes the resistance of the target active material into consideration to further accurately calculate the current ratio of the active materials.

Figure 10:
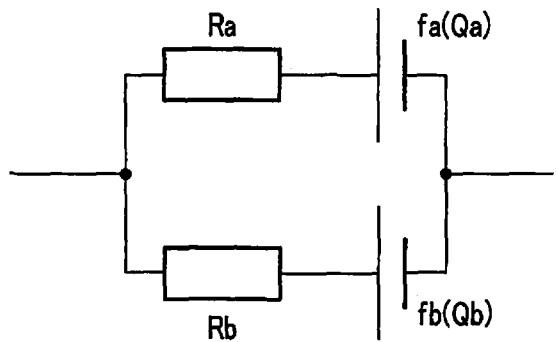
FIG. 10 is a diagram showing a circuit model of a target electrode used in the secondary battery system according to the fourth embodiment.

In consideration of the resistance of the active material, the target electrode can be represented as a circuit model illustrated in FIG. 10. To simplify the explanation, the target electrode denotes a cathode prepared by mixing the active material A and active material B as described in the first embodiment. In FIG. 10, Ra and Rb denote the resistances of the active material A and active material B, respectively. Furthermore, fa(Qa) and fb(Qb) denote the OCP for the active material A and for the active material B, respectively.

The resistance Ra and resistance Rb may be determined in advance. However, as discussed later in the fifth embodiment, these resistances may be estimated and updated as the deterioration of the secondary battery 110 advances. The resistance Ra may be determined, for example, as a value proportional to the reciprocal of the capacity (Ca*Ma) of the active material A. Similarly, the resistance Rb may be determined as a value proportional to the reciprocal of the capacity (Cb*Mb) of the active material B.

FIG. 10 shows a parallel circuit. This means that the sum of the OCP of the active material A and the voltage drop caused by the resistance of the active material A is equal to the sum of the OCP of the active material B and the voltage drop caused by the resistance of the active material B. In other words, equation (10) is established.

$$fa\left(\frac{Qa}{Ma}\right) + iaRa = fb\left(\frac{Qb}{Mb}\right) + ibRb \qquad (10)$$

It is assumed here that a charge/discharge current is passed over a short time period $\Delta t$. During this time, the charge amount of the cathode changes from Q to Q+i$\Delta t$. Concurrently, the charge amount of the active material A changes from Qa to Qa+iaΔt, and the charge amount of the active material B changes from Qb to Qb+ibΔt. Here, ia and ib denote the sizes of currents that pass through the active material A and active material B, respectively, during the short time period Δt. The ratio ia:ib is the current ratio calculated by the current ratio calculator 101.

The following equation (11) is derived by the first order approximation.

$$fa\left(\frac{Qa}{Ma}\right) + \frac{ia\Delta t}{Ma}fa'\left(\frac{Qa}{Ma}\right) + iaRa = fb\left(\frac{Qb}{Mb}\right) + \frac{ib\Delta t}{Mb}fb'\left(\frac{Qb}{Mb}\right) + ibRb \quad (11)$$

Equation (11) can be simplified as follows:

$$\begin{bmatrix} H1 & H2 \\ 1 & 1 \end{bmatrix}\begin{bmatrix} ia \\ ib \end{bmatrix} = \begin{bmatrix} H3 \\ i \end{bmatrix} \quad (12)$$

$$H1 = \frac{\Delta t}{Ma}fa'\left(\frac{Qa}{Ma}\right) + Ra$$

$$H2 = -\left(\frac{\Delta t}{Mb}fb'\left(\frac{Qb}{Mb}\right) + Rb\right)$$

$$H3 = fb\left(\frac{Qb}{Mb}\right) - fa\left(\frac{Qa}{Ma}\right)$$

By solving these simultaneous equations, the current ratio as expressed by equation (13) can be obtained.

$$ia:ib = \frac{H3 - H2i}{H1 - H2} : \frac{-H3 + H1i}{H1 - H2} \quad (13)$$

Figure 11:
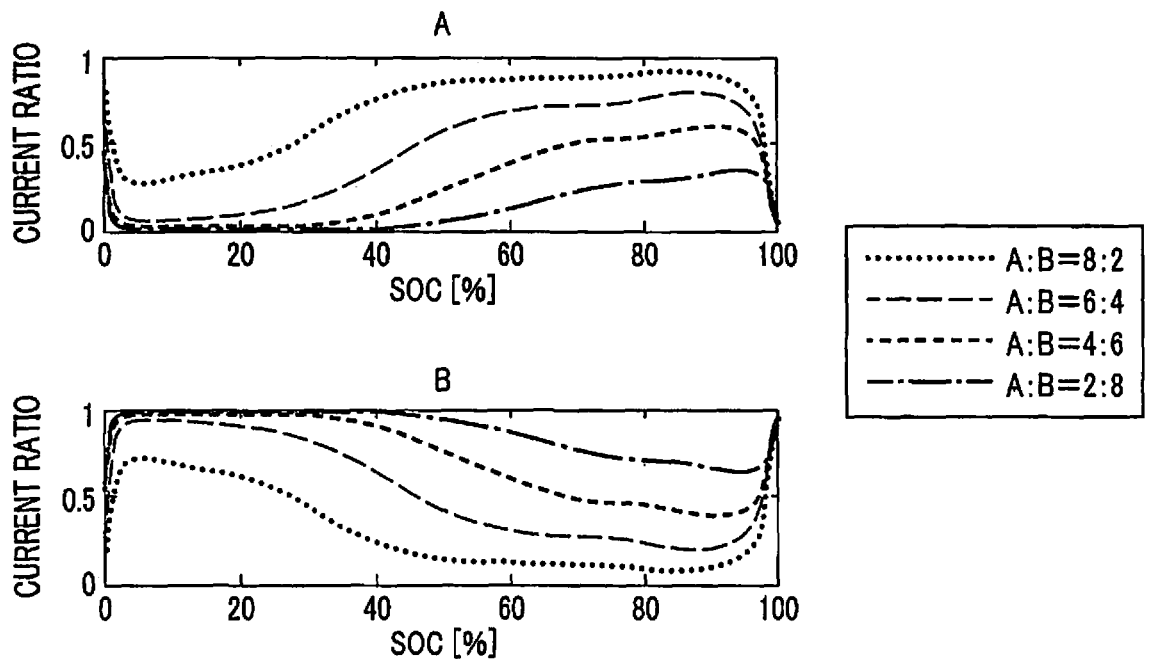
FIG. 11 is a graph showing the current ratio between the active materials in each of the electrodes of FIG. 3 calculated in accordance with the model of FIG. 10.

When the current ratios are calculated in the above manner for the cathodes having different mixture ratios as exemplified in FIG. 3, the graph of FIG. 11 can be obtained. In the example of FIG. 11, it is assumed that charging starts in the vicinity of the cathode SOC=0[%], and the resistances Ra and Rb are proportional to the reciprocal of the capacity Ma of the active material A and the reciprocal of the capacity Mb of the active material B, respectively.

As explained above, the secondary battery system according to the fourth embodiment differs from the secondary battery system according to the first embodiment in that the resistances of the target active materials are further taken into consideration when calculating the current ratio of the active materials. Thus, according to the present secondary battery system, the loads applied on the active materials that are included in the mixed electrode at the time of charging and discharging the secondary battery can be further accurately estimated, and employed for the charge/discharge control of the secondary battery and/or for setting the operational range of the secondary battery. As a result, according to this secondary battery system, the deterioration of the secondary battery that includes the mixed electrode containing multiple active materials can be suitably suppressed.

For the secondary battery system according to the second embodiment, the operational range of the secondary battery may be set by using the current ratio calculated by the scheme explained in the present embodiment. In addition, the secondary battery according to the third embodiment may be designed by using the current ratio calculated by the scheme explained in the present embodiment.

Fifth Embodiment

The secondary battery system according to the fifth embodiment can reduce errors in the current ratio by adopting regression calculation for estimation of part of the parameters that are used for the calculation of the current ratio described above in the first and fourth embodiments.

Figure 12:
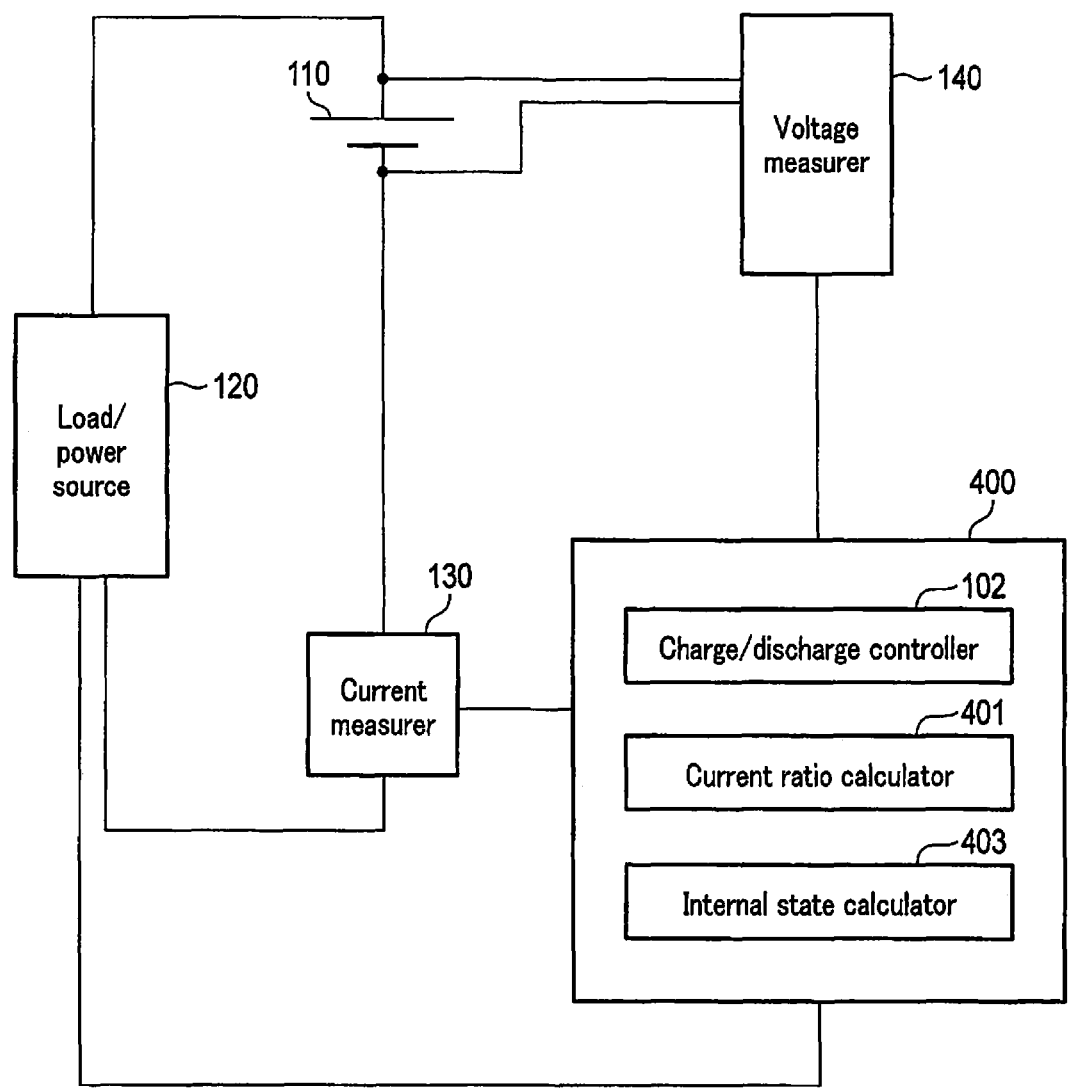
FIG. 12 is a block diagram showing the secondary battery system according to the fifth embodiment.

Specifically, as illustrated in FIG. 12, the secondary battery system according to the fifth embodiment includes a battery control apparatus 400, a secondary battery 110, a load/power source 120, a current measurer 130, and a voltage measurer 140.

In a manner similar to the above mentioned battery control apparatus 100, the battery control apparatus 400 calculates the current ratios of the currents passing through different active materials included in the electrode of the secondary battery 110 under different charge amounts of the target electrode of the secondary battery 110. Based on the relationship between the charge amount and the current ratio, the battery control apparatus 400 controls the current passing through the secondary battery 110 so that, for example, the charging rate and/or discharging rate of the secondary battery 110 can be reduced within a certain charge amount region.

In particular, the battery control apparatus 100 includes a current ratio calculator 401, a charge/discharge controller 102, and an internal state calculator 403.

As part or all of the parameters including capacities and/or resistances of the active material A and/or active material B, the current ratio calculator 401 uses the calculation results obtained by the internal state calculator 403. By using these parameters, the current ratio calculator 401 may perform the same or similar calculation to the calculation performed by the current ratio calculator 101.

The internal state calculator 403 performs the regression calculation based on the input data stored in the memory, such as measured or predicted current values and/or measured or predicted power values, and also measured or predicted (battery) voltage values. Based on the result of this regression calculation, the internal state calculator 403 updates at least part of the parameters stored in the memory.

The internal state calculator 403 may update the estimated capacities of the cathode/anode active materials, estimated cathode/anode initial charge amounts, and/or estimated internal resistance of the secondary battery (which may include resistance of each active material), based on the current and voltage values measured or predicted at multiple time points during the constant current charging by using the technique disclosed, for example, in JP-A 2015-111086 (KOKAI) or any similar technique.

Figure 13:
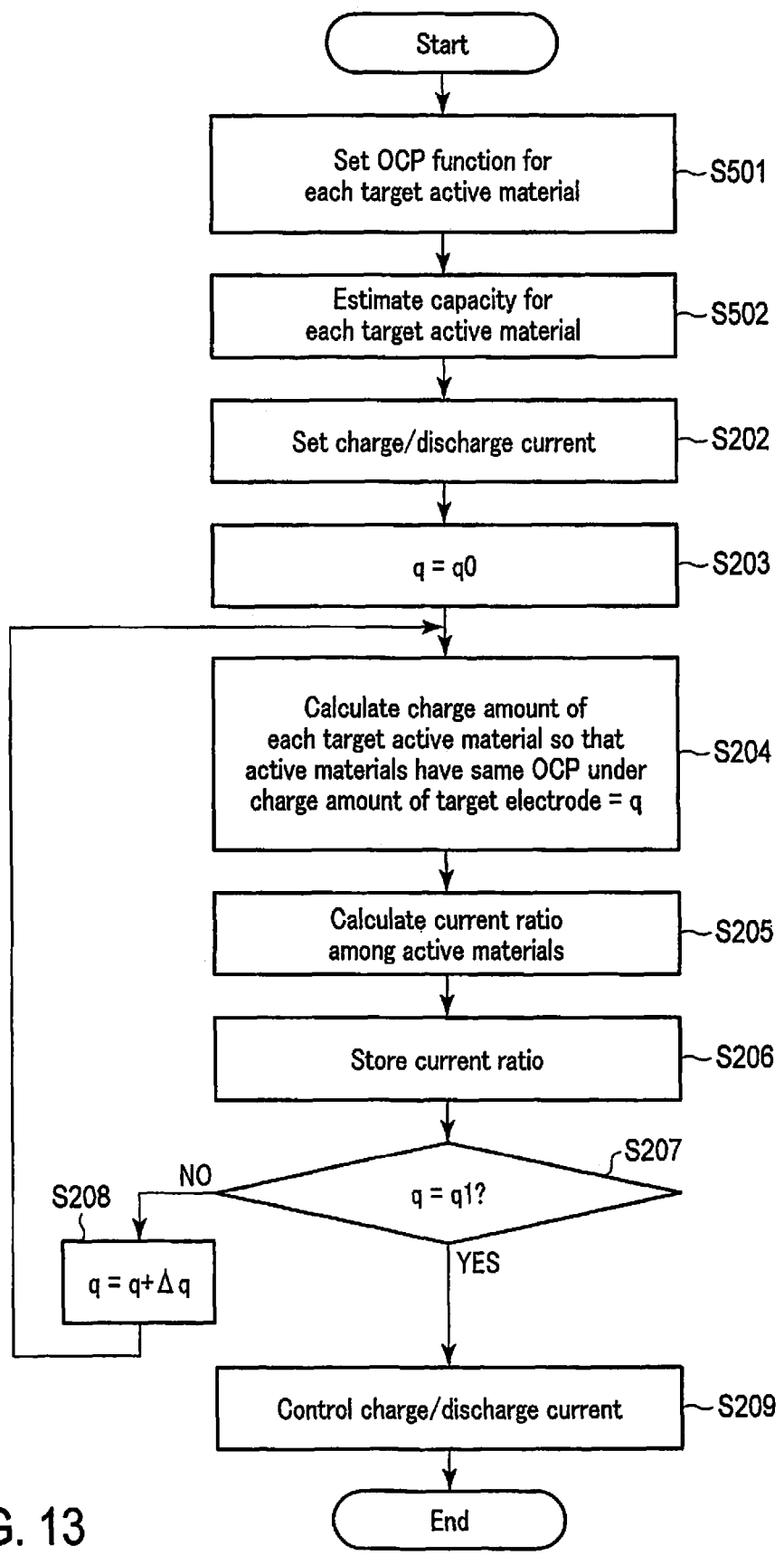
FIG. 13 is a flowchart showing the operation of the secondary battery system illustrated in FIG. 12.

Next, the operation of the secondary battery system of FIG. 12 is explained by referring to FIG. 13. First, the current ratio calculator 401 sets functions including an OCP function and its derivative for each target active material (step S501).

The internal state calculator 403 performs the regression calculation based on the above mentioned input data, and estimates the capacity for each target active material (step S502). At step S502, the internal state calculator 403 may estimate the capacities of part of the target active materials so that the capacities of the remaining active materials do not have to be estimated. In addition, at step S502, the internal state calculator 403 may estimate the resistances of part or all of the target active materials.

Furthermore, the current ratio calculator 401 sets the charge/discharge current amount of the secondary battery 110, for example, the above mentioned value i (step S202), and initializes a variable q that expresses the charge amount of the target electrode by substituting q0 for the variable (step S203).

Steps S501, S502, S202 and S203 may be executed in an order different from FIG. 13, or in parallel. The process at step S204 and after may be the same as or similar to FIG. 8, and thus is omitted from the explanation.

The secondary battery system according to the fifth embodiment adopts regression calculation to estimate and update part or all of the parameters used for the calculation of the current ratio described above in the first and fourth embodiments. In this manner, the secondary battery system can suppress errors in the current ratio, which tend to be caused when the actual internal state of the secondary battery from the parameters determined at the time of designing the secondary battery diverge in accordance with the deterioration of the secondary battery.

For the secondary battery system according to the second embodiment, the operational range of the secondary battery may be set by using the current ratio calculated by the scheme explained in the present embodiment. In addition, the secondary battery according to the third embodiment may be designed by using the current ratio calculated by the scheme explained in the present embodiment.

Sixth Embodiment

The fifth embodiment may be applicable to an assembled battery system having an assembled battery that contains multiple secondary batteries coupled to each other in parallel or in series.

Each of the secondary batteries contained in the assembled battery is configured to include a mixed electrode as explained in the above embodiments. However, the parameters such as the capacities of the active materials may not always be uniform among secondary batteries due to errors at the time of production and deterioration over time.

These secondary batteries are divided into battery modules. A battery module may include one secondary battery or multiple secondary batteries.

The assembled battery system according to the sixth embodiment may include, in addition to such an assembled battery, a battery control apparatus, a load/power source 120, a current measurer 130, and a voltage measurer 140. The battery control apparatus includes a current ratio calculator, an internal state calculator, and a charge/discharge controller.

This current ratio calculator calculates the current ratio for every battery module in a manner similar to the above mentioned current ratio calculator 401. The current ratio calculator may calculate, based on the capacity and the capacity-versus-potential properties of the active material A of a secondary battery included in a battery module and the capacity and the capacity-versus-potential properties of the active material B of this secondary battery, the current ratios of the current passing through the active material A of the secondary battery and the current passing through the active material B of the secondary battery when the charge amount of the cathode of the secondary battery is changed to take different values.

Furthermore, this internal state calculator updates parameters including the capacities of the active materials and the resistances of the active materials for each battery module, in a manner similar to the internal state calculator 403. The internal state calculator may perform regression calculation, based on the input data including (a) the current/power measurement values measured at multiple time points during the time of charging and discharging a battery module, and/or (b) the estimate current/power values at multiple time points during the time of charging and discharging the battery module, and update the capacity of the active material A of the secondary battery included in the battery module and the active material B of the secondary battery.

Furthermore, this charge/discharge controller determines the (recommended) charging/discharging rate for every battery module in a manner similar to the above charge/discharge controller 102. The charging/discharging rate, however, cannot be controlled for each battery module, but an assembled battery needs to be controlled as a whole. The charge/discharge controller therefore determines the charging/discharging rate of the assembled battery based on the recommended charging/discharging rates that are determined for the multiple battery modules, based on which the charge/discharge controller controls the charging/discharging rate of the assembled battery. This charge/discharge controller differs from the above mentioned charge/discharge controller 102 in this respect.

For example, the charge/discharge controller may determine the recommended charging/discharging rate of the battery module when the charge amount of the cathode of the secondary battery takes the first value, based on the capacity of the active material A of the secondary battery included in the battery module, the capacity of the active material B of the secondary battery, and the current ratio when the charge amount of the cathode of the secondary battery takes the first value. The charge/discharge controller may control the charging/discharging rate of the assembled battery, based on statistical values of the recommended charging/discharging rates determined for the multiple battery modules such as the minimum value, average value, median value, and mode. Alternatively, the charge/discharge controller may select the most deteriorated battery module, such as a battery module for which the parameter calculated by the internal state calculator most diverges from the initial value, and control the charging/discharging rate of the assembled battery by using the recommended charging/discharging rate determined for the selected battery module.

As discussed above, the assembled battery system according to the sixth embodiment determines the recommended charging/discharging rate for each of the battery modules obtained by dividing secondary batteries included in the assembled battery in a manner similar to the fifth embodiment, and further determines the charging/discharging rate of the assembled battery based on the recommended charging/discharging rates determined for these battery modules. Thus, this assembled battery system can suppress the deterioration of the assembled battery containing not only one battery module but also multiple battery modules.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A secondary battery system comprising:
   a secondary battery comprising a first electrode including a first active material and a second active material, and a second electrode including at least a third active material;
   a current ratio calculator configured to calculate a current ratio of a current passing through the first active material and a current passing through the second active material for each of different values of a charge amount of the first electrode, based on a capacity and capacity-versus-potential properties of the first active material and a capacity and capacity-versus-potential properties of the second active material; and
   a controller configured to, based on the capacity of the first active material, the capacity of the second active material and the current ratio when the charge amount of the first electrode takes a first value, control the current passing through the secondary battery when the charge amount of the first electrode indicates the first value.

2. The system according to claim 1, wherein the controller restricts a current rate for at least one of charging and discharging the secondary battery when the charge amount of the first electrode takes the first value, based on the capacity of the first active material, the capacity of the second active material, and the current ratio when the charge amount of the first electrode takes the first value.

3. The system according to claim 1, wherein the controller calculates a first ratio of the current passing through the first active material to the current passing through the first electrode when the charge amount of the first electrode takes the first value, based on the current ratio when the charge amount of the first electrode takes the first value, and reduces a current rate for charging and/or discharging the secondary battery when the charge amount of the first electrode takes the first value on condition of a product of (a) the first ratio, (b) a reciprocal of a second ratio of the capacity of the first active material to a capacity of the first electrode, and (c) charging rate or discharging rate of the secondary battery, exceeding a threshold value.

4. The system according to claim 1, wherein the current ratio calculator calculates the current ratio, based further on a first function that returns a potential of the first active material with a charge amount of the first active material per unit mass as an argument and a second function that returns a potential of the second active material with a charge amount of the second active material per unit mass as an argument.

5. The system according to claim 1, wherein the current ratio calculator calculates the current ratio, based further on a resistance of the first active material and a resistance of the second active material.

6. The system according to claim 1, further comprising an internal state calculator configured to perform regression calculation based on input data including at least one of (a) measurement values of currents and/or powers measured at a plurality of time points during charging and/or discharging the secondary battery and (b) estimated values of currents and/or powers at a plurality of time points during charging and/or discharging the secondary battery, and to update the capacity of the first active material and the capacity of the second active material.

7. A secondary battery comprising:
   a first electrode including a first active material and a second active material; and
   a second electrode including at least a third active material,
   wherein an initial charge amount of the second electrode is larger than an initial charge amount of the first electrode, and
   in at least part of a range in which the charge amount of the first electrode is smaller than the initial charge amount of the second electrode, a product of (a) a first ratio of a current passing through the first active material to a current passing through the first electrode, (b) a reciprocal of a second ratio of a capacity of the first active material to a capacity of the first electrode, and (c) a charging rate or discharging rate of the secondary battery, exceeds a threshold value.

8. An assembled battery system comprising an assembled battery that includes a plurality of secondary batteries coupled in parallel or in series, wherein
   each of the secondary batteries includes a first electrode including a first active material and a second active material, and a second electrode including at least a third active material, and
   the system further comprises:
      an internal state calculator configured to perform regression calculation for each of a plurality of battery modules obtained by dividing the secondary batteries, based on input data including at least one of (a) measurement values of currents and/or powers measured at a plurality of time points during charging and/or discharging each battery module and (b) estimated values of currents and/or powers at a plurality of time points during charging and/or discharging the battery module, and to update a capacity of the first active material of the secondary battery included in the battery module and a capacity of the second active material of the secondary battery;
      a current ratio calculator configured to calculate for each of the battery modules and for each of different values of a charge amount of the first electrode of the secondary battery included in the battery module a current ratio of a current passing through the first active material of the secondary battery and a current passing through the second active material of the secondary battery, based on the capacity and capacity-versus-potential properties of the first active material of the secondary battery and the capacity and capacity-versus-potential properties of the second active material of the secondary battery; and
      a controller configured to determine a recommended current rate, for each of the battery modules, for charging and/or discharging the battery module when the charge amount of the first electrode of the secondary battery included in the battery module takes a first value, based on (a) the capacity of the first active material of the secondary battery, (b) the capacity of the second active material of the secondary battery, and (c) the current ratio when the charge amount of the first electrode of the secondary battery takes the first value, and to control a current passing through the assembled battery, based on the recommended current rate determined for each of the battery modules.

9. The system according to claim 8, wherein the controller controls a current rate for charging and/or discharging the assembled battery, using a statistical value of the recommended current rate determined for each of the battery modules.

10. The system according to claim 8, wherein the controller selects one of the battery modules based on a degree of divergence with respect to an initial value of the capacity of the first active material and/or the capacity of the second active material updated for the battery modules, and controls a current rate for charging and/or discharging the assembled battery, using a recommended current rate determined for the selected battery module.

* * * * *

UNITED STATES PATENT AND TRADEMARK OFFICE
CERTIFICATE OF CORRECTION

| | |
|---|---|
| PATENT NO. | : 11,394,222 B2 |
| APPLICATION NO. | : 16/556266 |
| DATED | : July 19, 2022 |
| INVENTOR(S) | : Nobukatsu Sugiyama et al. |

Page 1 of 1

It is certified that error appears in the above-identified patent and that said Letters Patent is hereby corrected as shown below:

In the Claims

Claim 3, Column 19, Line 41:
"and (c) charging rate or discharging rate"
Should read:
--and (c) a charging rate or discharging rate--.

Signed and Sealed this
Twenty-fifth Day of April, 2023

Katherine Kelly Vidal
*Director of the United States Patent and Trademark Office*